(12) United States Patent
Patrizi et al.

(10) Patent No.: US 9,825,639 B2
(45) Date of Patent: Nov. 21, 2017

(54) VIBRATION OPTIMIZING INTELLIGENT PHASE LOCKED LOOP

(71) Applicant: Raytheon Company, Waltham, MA (US)

(72) Inventors: Michael R. Patrizi, Allen, TX (US); Nathan R. Francis, Dallas, TX (US); Matthew J. Koeth, Plano, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/058,438

(22) Filed: Mar. 2, 2016

(65) Prior Publication Data

US 2017/0257105 A1    Sep. 7, 2017

(51) Int. Cl.
| | | |
|---|---|---|
| *H03L 7/00* | (2006.01) | |
| *H03L 7/107* | (2006.01) | |
| *H03L 7/099* | (2006.01) | |
| *G01H 1/00* | (2006.01) | |
| *G01P 15/00* | (2006.01) | |

(52) U.S. Cl.
CPC .............. *H03L 7/1075* (2013.01); *G01H 1/00* (2013.01); *G01P 15/00* (2013.01); *H03L 7/00* (2013.01); *H03L 7/099* (2013.01)

(58) Field of Classification Search
CPC ....... H03L 7/0898; H03L 7/00; H03L 7/1075; G01H 1/00; G01P 15/00
USPC ................................ 331/16, 34, 17; 327/156
See application file for complete search history.

(56) References Cited

U.S. PATENT DOCUMENTS

| | | | |
|---|---|---|---|
| 4,891,611 A | 1/1990 | Frerking | |
| 5,710,720 A | 1/1998 | Algrain et al. | |
| 8,044,724 B2 * | 10/2011 | Rao et al. | H03L 7/0898 |
| | | | 331/16 |
| 2014/0104006 A1 * | 4/2014 | Clark et al. | H03L 7/00 |
| | | | 331/29 |

FOREIGN PATENT DOCUMENTS

| | | |
|---|---|---|
| CN | 1877998 A | 12/2006 |
| JP | H 10224211 | 8/1998 |
| JP | 2001156633 | 6/2001 |
| WO | WO 2015/039330 A1 | 3/2015 |

OTHER PUBLICATIONS

PCT International Search Report and Written Opinion dated Mar. 8, 2017 for PCT/US2016/064101; 83 Pages.

* cited by examiner

*Primary Examiner* — Arnold Kinkead
(74) *Attorney, Agent, or Firm* — Daly, Crowley, Mofford & Durkee, LLP (57) ABSTRACT

The present disclosure is directed towards systems and method for actively tuning a phase locked loop based on vibration excitation levels experienced by the phase locked loop. A bandwidth of the phase locked loop can be actively increased or decreased based upon a detected vibration level. In an embodiment, the phase locked loop includes a controllable oscillator, an output module, a filter module and a detector. The filter module can be configured to receive a bandwidth control signal to modify a bandwidth of the phase locked loop based on a vibration signal. In an embodiment, the vibration signal corresponds to a vibration level experienced by the phased locked loop. The detector can be configured to receive a PLL output signal from the output module and to receive a PLL input signal.

17 Claims, 10 Drawing Sheets

VIBRATION OPTIMIZING INTELLIGENT PHASE LOCKED LOOP

BACKGROUND

As is known in the art, phase-locked loops (PLLs) are frequently used to generate a stable local oscillator (LO) signal. The generation of a system LO signal is designed to meet a specific performance. However, this performance can be impacted by environmental conditions, such as vibration. Thus, designers typically design conventional systems around these environmental conditions at the cost of performance.

One aspect of the design of a PLL is its loop bandwidth. To maintain an acceptable performance against any particular environmental condition (e.g., vibration), in conventional systems, the PLL loop bandwidth is typically designed at a non-optimal point with respect to its performance. The performance and characteristics of the conventional PLL are traded or compromised to account for the environmental conditions. Further, the PLL is designed with fixed values and points, typically based on worst-case environmental conditions, providing a PLL design point that is not optimal and cannot adapt to changes in its environment.

SUMMARY

The present disclosure is directed to a phase locked loop that is actively tuned based on a vibration level experienced by the phase locked loop. A bandwidth of the phase locked loop can be increased or decreased based upon a detected vibration level.

Illustrative embodiments provide a closed loop network that can self-detect vibration excitation and actively adjust a phase locked loop bandwidth. In some embodiments, the bandwidth is adjusted to a predetermined preferred point based on the detected vibration excitation level. By actively tuning the bandwidth of the phase locked loop, the system LO parameters (e.g., phase noise, spurious performance, tuning speed) can be operated across different operational scenarios.

In embodiments, temperature compensation is embedded into the tunability of the phase locked loop. Certain parameters (e.g., loop bandwidth) of a phase locked loop may change over an operational temperature range. Due to the tunable nature of the loop bandwidth, some embodiments of this disclosure could embed temperature effects into the dynamic tuning of the loop filter, thus reducing the typical variance of phase locked loops over temperature.

In an embodiment, an accelerometer is positioned in proximity to a phase locked loop. The accelerometer can detect axial vibration magnitude and frequency, which is subsequently reported to a controller of the phase locked loop. Using the detected vibration energy, the controller can provide a bandwidth signal to actively tune a loop filter (e.g., low pass filter) within the phase locked loop to change (e.g., decrease or increase) the bandwidth of the PLL. The loop filter may include a digitally addressable, chip-scale MEMS capacitor bank and/or a potentiometer, each of which may be tuned to change the bandwidth.

In one aspect, the present disclosure is directed towards a system having a phase locked loop. In an embodiment, the phase locked loop includes a controllable oscillator having an input and an output and an output module coupled to the output of the oscillator. The phase locked loop further includes a filter module coupled to the input of the oscillator. The filter module is configured to receive a bandwidth control signal to modify a bandwidth of the phase locked loop based on a vibration signal, which corresponds to a vibration level experienced by the phased locked loop. The phase locked loop further includes a detector coupled to an input of the filter module. The detector is configured to receive a PLL output signal from the output module and to receive a PLL input signal.

In some embodiments, a controller is coupled to the filter module. The controller can be configured to receive the vibration signal and to output the bandwidth control signal to the filter module to modify the bandwidth of the phase locked loop based on the vibration signal. An accelerometer may be included to detect vibration energy and generate the vibration signal.

In an embodiment, the filter module is configured for a first bandwidth corresponding to the vibration level at or above a first threshold and a second bandwidth corresponding to the vibration level at or below the first threshold. In one embodiment, the first bandwidth is less than the second bandwidth. The filter module can be configured to modify the bandwidth of the phase locked loop so that a frequency of the vibration level experienced by the phased locked loop is outside the second bandwidth.

In some embodiments, the filter module includes a potentiometer controlled by the bandwidth control signal. In other embodiments, the filter module includes at least one adjustable capacitor controlled by the bandwidth control signal.

The filter module can be configured to reduce the bandwidth as the vibration level increases. Alternatively, the filter module can be configured to increase the bandwidth as the vibration level decreases.

In another aspect, the present disclosure is directed to a method for tuning a phase locked loop. The method includes receiving a bandwidth control signal to modify a bandwidth of a phase locked loop based on a vibration signal. The vibration signal corresponds to a vibration level experienced by the phased locked loop. The method further includes selecting one of a plurality of bandwidths based on the bandwidth control signal and modifying the bandwidth of the phase locked loop to the selected bandwidth.

In some embodiments, the method includes receiving the vibration signal and generating the bandwidth control signal to modify the bandwidth of the phase locked loop based on the vibration signal. A detector may be provided to generate the vibration signal corresponding to the vibration level.

In an embodiment, the method includes reducing the bandwidth as the vibration level increases. In some embodiments, the method includes increasing the bandwidth as the vibration level decreases.

The phase locked loop may include a filter module and the filter module can be configured for a first bandwidth corresponding to the vibration level at or above a first threshold and a second bandwidth corresponding to the vibration level at or below the first threshold. The first bandwidth may be less than the second bandwidth.

In some embodiments, the method includes modifying a capacitance value within the filter module based on the bandwidth control signal to transition the filter module from the first bandwidth to the second bandwidth. In other embodiments, the method includes modifying a resistance value within the filter module based on the bandwidth control signal to transition the filter module from the first bandwidth to the second bandwidth. In some embodiments, resistance and capacitance values of components in the filter module are modified.

In some embodiments, the method includes receiving the bandwidth control signal to modify the bandwidth of the phase locked loop based on the vibration signal. The vibration signal may correspond to a second vibration level experienced by the phased locked loop, wherein the second vibration level is below the first threshold. The bandwidth of the filter module may be modified from the first bandwidth to the second bandwidth responsive to the bandwidth control signal.

In another aspect, the present disclosure is directed to a phase locked loop having a controllable oscillator for generating an oscillator signal and a means for receiving the oscillator signal and generating a PLL output signal. The phase locked loop further includes a means for receiving a bandwidth control signal to modify a bandwidth of the phase locked loop based on a vibration signal. The vibration signal corresponds to a vibration level experienced by the phased locked loop. The phase locked loop further includes a detector for receiving the PLL output signal and a PLL input signal.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

The present disclosure is directed to a tunable phase locked loop that can be actively tuned based upon a vibration energy experienced by the phase locked loop. In an embodiment, the system includes a closed-loop network that self-detects vibration energy and optimizes the phase locked loop and avoids mid-band vibration effects.

In an embodiment, a phase-locked loop or phase lock loop (PLL) comprises a control system that generates an output signal whose phase is related to the phase of an input signal. Phase locked loops typically include a phase detector, loop filter and an oscillator. The oscillator generates a periodic output signal. The phase detector compares the phase of the output signal with the phase of an input signal and generates an error signal. The error signal corresponds to a phase difference between the two signals. This error signal is used to adjust the oscillator to keep the phases matched. Disposed between the phase detector and the oscillator is the loop filter (e.g., low pass filter) that filters the error signal before providing the error signal to the oscillator. Further, the oscillator and the phase detector can be coupled together through a feedback loop that feeds the output of the oscillator to the phase detector, thus forming the loop.

Illustrative embodiments include a phase locked loop having a dynamically controllable bandwidth that allows the phase locked loop to adapt to changes in detected vibration excitation levels experienced by the phase locked loop. For example, the phase locked loop can decrease (i.e., narrow) a bandwidth as a vibration excitation level increases. Further, the phase locked loop can increase (i.e., widen) its bandwidth as a vibration excitation level decreases. In some embodiments, the phase locked loop is tuned substantially simultaneously as the vibration energy is detected. Instead of hard-wiring a non-optimal solution to accommodate an environment as in conventional systems, phase locked loop embodiments discussed herein dynamically adapt to the environment and, more specifically, to vibration excitation levels.

To modify the bandwidth, the phase locked loop can include a tunable loop filter (e.g., low pass filter). Based on the detected vibration energy, the phase locked loop can self-tune its loop filter to provide optimal electrical performance and still account for the detected vibration excitation.

The tunable loop filter can include elements, such as a potentiometer having a variable resistance, and/or a capacitor element having a variable capacitance. The resistance and capacitance values of the potentiometer and capacitor element respectively can be modified according to a detected vibration excitation level.

In an embodiment, an accelerometer (e.g., a triple-axis accelerometer) and controller can be disposed proximate to the phase locked loop. In one embodiment, the accelerometer is configured to sense the magnitude and/or frequency of a vibration corresponding to a vibration energy experienced by the phase locked loop. The accelerometer can transmit the detected vibration information to the controller, which can generate a bandwidth control signal to modify the bandwidth of the phase locked loop.

Figure 1:
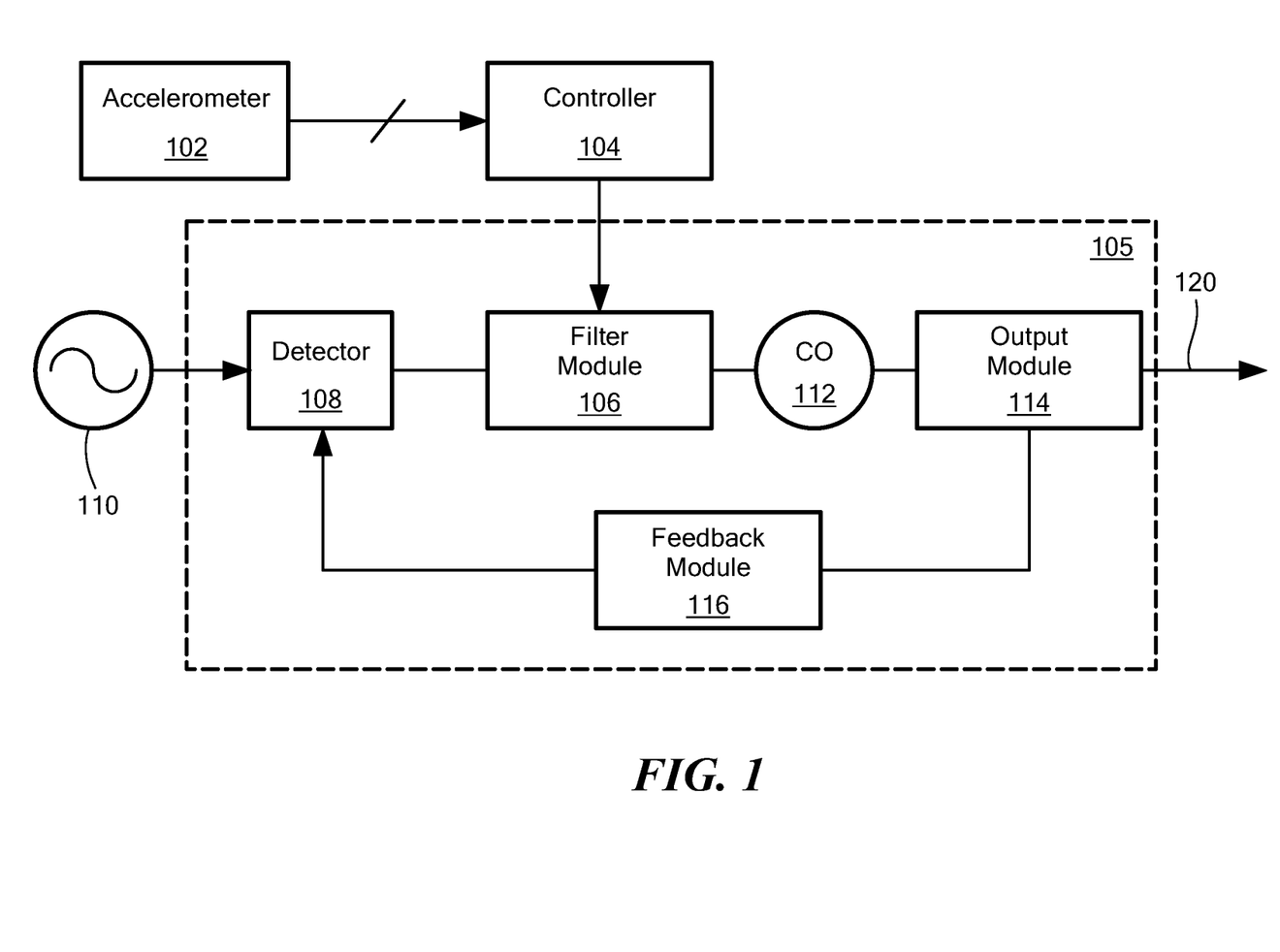
FIG. 1 is a block diagram of a system having a tunable phase locked loop.

Now referring to FIG. 1, an accelerometer 102 and a controller 104 are coupled to a phase locked loop 105. In an embodiment, accelerometer 102 is configured to detect vibration corresponding to a vibration energy experienced by phase locked loop 105 and generate a vibration signal that is transmitted to an input of the controller 104. Controller 104 is configured to receive the vibration signal and generate a bandwidth control signal. In some embodiments, the bandwidth control signal may be a command signal indicating a new bandwidth for phase locked loop 105, as will be discussed in greater detail below.

In an embodiment, phase locked loop 105 receives the bandwidth control signal from controller 104. Phase locked loop 105 includes a detector 108, filter module 106, a controllable oscillator 112, an output module 114 and a feedback module 116.

In an embodiment, accelerometer 102 detects an axial vibration magnitude and frequency corresponding to the vibration energy experienced by phase locked loop 105. For example, accelerometer 102 may detect the magnitude and frequency of vibration in three axes (e.g., x-axis, y-axis, z-axis). In one embodiment, accelerometer 102 includes a multi-axial, Micro-Electro-Mechanical Systems (MEMS) based accelerometer. It should be appreciated that any practical type of accelerometer or device configured to sense or detect vibration may be used.

In an embodiment, controller 104 comprise a central processing unit (CPU), a microcontroller, a field-programmable gate array (FPGA), a processor or a multi-core processor, or other circuitry capable of generating the bandwidth control signal. The controller 104 may include logic circuitry that is configured to receive data, process the data and generate command signals or instructions. For example, controller 104 may include hardware, software or a combination of the two. In one embodiment, controller 104 may include a single integrated circuit (IC) chip. In some embodiments, controller 104 comprises a computer system, such as computer 400 described below with respect to FIG. 4.

In an embodiment, detector 108 includes a phase detector configured to compare two signals and generate an error signal proportional to the phase difference between the two signals. For example, an input of detector 108 may be coupled to a phase locked loop (PLL) input signal 110 (i.e., reference signal) and feedback module 116. Feedback (FB) module 116 provides a FB module output signal to detector 108. In some embodiments, FB module output signal is based on PLL output signal 120 (i.e., output signal of phase locked loop 105). In an embodiment, detector 108 compares the PLL input signal 110 to the FB module output signal and generates an error signal proportional to the phase difference between the PLL input signal 110 and the FB module output signal.

It should be appreciated that feedback module 116 is optional and in some embodiments, detector 108 may be coupled to output module 114 and be configured to receive PLL output signal 120 from output module 114. In such an embodiment, detector 108 compares PLL input signal 110 to PLL output signal 120 and generates an error signal proportional to the phase difference between PLL input signal 110 and PLL output signal 120.

In an embodiment, the error signal is used to drive controllable oscillator 112. For example, if a phase difference is detected between the PLL input signal 110 and the PLL output signal 120, detector 108 generates an error signal to modify (e.g., decrease a frequency, increase a frequency) an output of controllable oscillator 112 to phase lock the PLL output signal 120 to PLL input signal 110.

An output of detector 108 is coupled to an input of filter module 106. Thus, filter module 106 is configured to receive the error signal from detector 108. In some embodiments, filter module 106 includes a low pass filter. Filter module 106 may have a bandwidth defined by two frequencies. For example, the bandwidth may have a first frequency that establishes a lower bound and a second frequency that establishes an upper bound of allowable frequencies. In some embodiments, the lower bound and upper bound may be referred to as cut-off frequencies. Thus, filter module 106 can pass signals having a frequency between with the established bandwidth range, between the lower bound and upper bound, and attenuate signals having a frequency outside the established bandwidth range. For example, filter module 106 can attenuate portions of signals that have a frequency less than the lower bound and signals that have a frequency greater than the upper bound.

In an embodiment, the bandwidth of filter module 106 can be actively tuned based on certain parameters of the local oscillator of phase locked loop 105 and/or conditions of an environment in which the phase locked loop 105 is disposed. For example, the bandwidth can be modified according to specific performance metrics or thresholds for parameters such as upon phase noise, tuning speed, spurious performance and variability under vibration at a plurality of vibration excitation levels.

In an embodiment, the low pass filter of filter module 106 may include tunable elements such as a potentiometer and/or a capacitor element. The potentiometer or capacitor impedance may be tuned (e.g., adjusted) to meet a new bandwidth corresponding to a detected vibration level.

For example, the output of controller 104 can be coupled to the filter module 106. Filter module 106 can be configured to receive the bandwidth control signal from controller 104. The bandwidth control signal may include new or modified values for components (e.g., potentiometer, capacitor element) of filter module 106 to meet a new bandwidth responsive to the detected vibration energy. For example, filter module 106 can be configured for a plurality of bandwidths, each bandwidth corresponding to a different vibration level. When a particular vibration level is detected, a bandwidth of filter module 106 can be tuned (e.g., decreased, increased) to the new bandwidth corresponding to the detected vibration level, as will be discussed in greater detail below.

An output of filter module 106 is coupled to an input of controllable oscillator 112. In some embodiments, controllable oscillator 112 includes a voltage controlled oscillator (VCO). In one embodiment, a controllable oscillator 112 includes an electronic oscillator having an oscillation frequency that can be controlled by a control signal. In an embodiment, the control signal can be a voltage input that can determine the instantaneous oscillation frequency.

In some embodiments, controllable oscillator 112 may be driven by (i.e., controlled by) the output of filter module 106 and detector 108. In an embodiment, controllable oscillator 112 has a variable frequency capability and is configured to generate a periodic output signal. In some embodiments, this output signal corresponds to the output of phase locked loop 105 (i.e., PLL output signal 120).

An output of controllable oscillator 112 is coupled to an input of output module 114. In an embodiment, output module 114 is configured to generate PLL output signal 120. In some embodiments, such as the illustrative embodiment of FIG. 1, phase locked loop 105 includes a feedback loop (e.g., negative feedback loop) and output module 114 is configured to provide PLL output signal 120 to an input of feedback module 116.

An output of feedback module 116 is coupled to an input of detector 108 and may be configured to provide PLL input signal to detector 108. In some embodiments, feedback module 116 includes a divider configured to make PLL output signal 120 a rational multiple of a reference frequency (e.g., frequency of PLL input signal 110). In one embodiment, feedback module 116 is configured to produce a frequency synthesizer that is used to generate a range of frequencies from a single fixed oscillator. It should be appreciated that a divider is optional may be included or not included based upon needs of a particular application.

Accelerometer 102, controller 104 and phase locked loop 105 may be components of the same system, circuit or network. In other embodiments, accelerometer 102, controller 104 and phase locked loop 105 may be components of one or more different systems, circuits or networks and may be communicatively coupled together. Accelerometer 102 may be disposed (e.g., embedded) such that it is proximate to or within a predetermined distance of phase locked loop 105 and be configured to detect vibration experienced by phase locked loop 105.

As stated above, the bandwidth of phase locked loop 105 can be controlled by the bandwidth control signal received by controller 104. The bandwidth can be actively tuned based on a vibration energy level experienced by phase locked loop 105. In some embodiment, to tune the bandwidth of phase locked loop 105, filter module 106 includes tunable components.

Figure 1A:
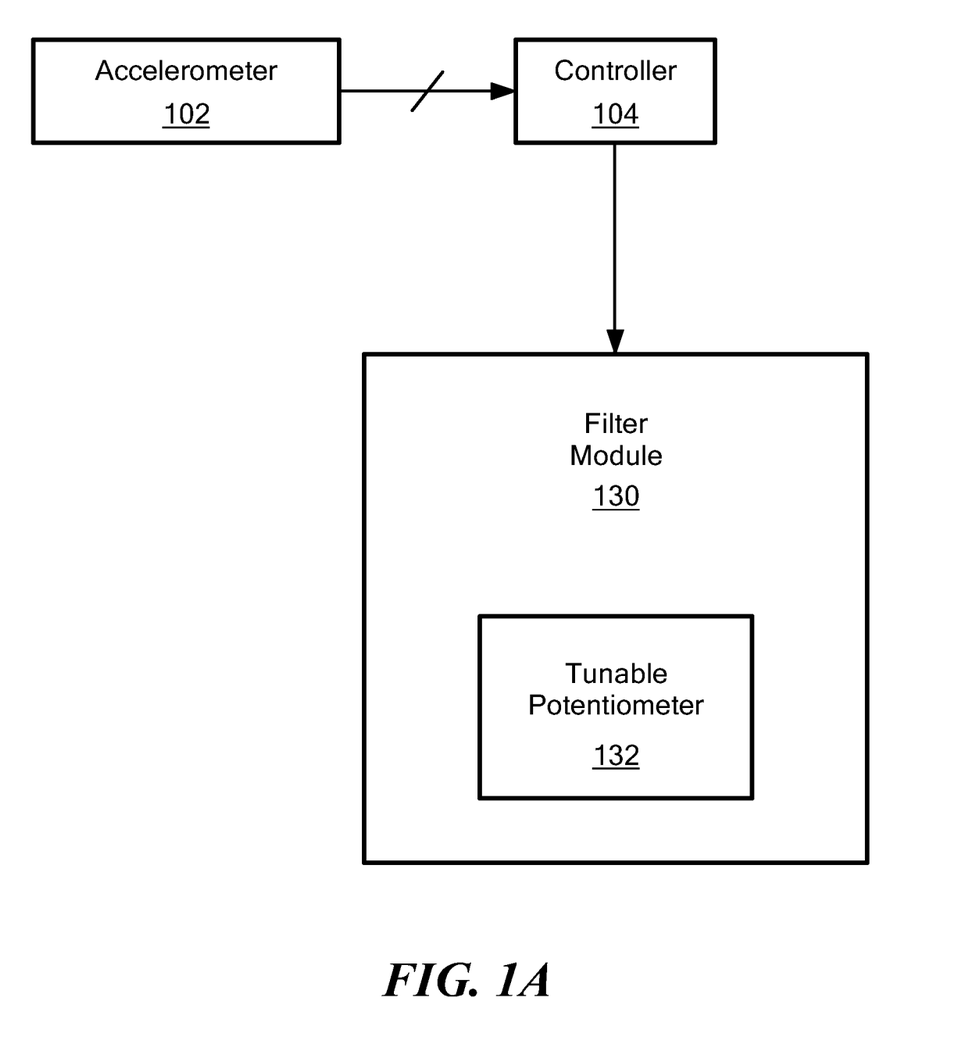
FIG. 1A is a block diagram of a filter module of a phase locked loop having a tunable potentiometer.

Now referring to FIG. 1A, a filter module 130 is coupled to accelerometer 102 through controller 104. In an embodiment, filter module 130 is the same as or substantially similar to filter module 106 of phase locked loop 105 of FIG. 1. Filter module 130 includes a tunable potentiometer 132.

In an embodiment, accelerometer 102 is disposed proximate to filter module 103 and is configured to detect vibration corresponding to a vibration energy experienced by filter module 130 and generate a vibration signal that is transmitted to controller 104. In some embodiments, the vibration signal includes a voltage signal corresponding to the detected vibration energy or a range of detected vibration energy.

Controller 104 is configured to receive the vibration signal and generate a bandwidth control signal. In some embodiments, the bandwidth signal includes a binary signal indicating whether the phase locked loop should operate in a first mode with a first bandwidth or a second mode with a second bandwidth. In one embodiment, the bandwidth control signal includes a serial pulse train having a train of pulses to transition the filter module 130 from one state to one of a plurality of different modes (e.g., states), whereby each mode can correspond to a different bandwidth. In other embodiments, the bandwidth control signal may be communicated through parallel transmission.

In some embodiments, to generate the bandwidth signal, controller 104 may include a look-up table. The look-up table may include performance characteristics of a phase locked loop at various vibration excitations. Further, the look-up table may include a corresponding bandwidth for each vibration excitation level.

In some embodiments, the look-up table includes various points of stability for the phase locked loop. A point of stability may refer to a point at which the phase locked loop is electrically stable and meets predetermined performance thresholds. Each stability point can correspond to the performance of the phase locked loop at different vibration excitation levels and can have a predetermined bandwidth to meet a respective performance threshold. In some embodiments, this information may correspond to a transfer function of the loop filter for the loop bandwidth. For example, in an embodiment, the phase locked loop may include two controllable capacitors, each with N states. The look-up table may include values for the two controllable capacitors up to $N^2$ states. In some embodiments, the controllable elements of the phase locked loop (e.g., capacitors, potentiometer) may have 4-6 states.

For example, a bandwidth may be predetermined for each vibration excitation level such that parameters of the phase locked loop (e.g., phase noise, tuning speed, phase lock time, spurious performance) are selected to meet the desired performance threshold and the vibration excitation level. For example, the loop bandwidth can determine the frequency and phase lock time, thus any adjustment to the bandwidth must also consider the impact on the frequency and phase lock time. Further, a lower value bandwidth can lead to reduced levels of phase noise and reference spurs, but at the expense of longer phase lock times and less phase margin.

Thus, each particular application of the phase locked loop can have unique or specific performance thresholds for each parameter or a combination of the different parameters (e.g., a specified phase noise level, tuning speed, phase lock time, spurious performance, etc.). A performance threshold can be based on an acceptable modification to one or a combination of the parameters that allow the phase locked loop to remain electrically stable and appropriately attenuate the detected vibration excitation level. In an embodiment, the points of stability can include predetermined bandwidths that are based on the particular parameters and environment of the phase locked loop and account for any changes to these parameters after the modification to the bandwidth. As referred to herein, points of stability correspond to when the phase locked loop is considered to be electrically stable. Electrically stable may generally refer to various points at which the circuit system has sufficient gain/phase margin to maintain and not lose its phase lock.

In an embodiment, the phase locked loop and filter module 130 have a range of stability points, from a minimum point of stability to a maximum point of stability. The bandwidth of the phase locked loop (and the bandwidth of filter module 130) can be tuned to different points of stability based on the detected vibration excitation level.

In other embodiments, the bandwidth may be determined based on a structural model of the phase locked system. For example, the latency (i.e., tuning speed) of the phase locked loop is inversely proportional to the loop bandwidth. Therefore, if the loop bandwidth increases by a factor of 10, the latency can decrease by the same factor of 10. Thus, the appropriate bandwidth for a specific vibration excitation level may be extracted analytically based on the structural model of the overall system.

In the illustrative embodiment of FIG. 1A, filter module 130 includes tunable potentiometer 132. The bandwidth control signal may include new or modified values for tunable potentiometer 132 to modify the bandwidth of filter module 130 to the desired bandwidth. Thus, an output or resistance of tunable potentiometer 132 can be controlled by the bandwidth control signal.

Tunable potentiometer 132 may have a variable resistive element. For example, in one embodiment, potentiometer 132 includes a three-terminal resistor whereby one of the three terminals can be a sliding contact (i.e., wiper) that moves along the element making electrical contact with at least one of a plurality of terminals. As the sliding contact changes position, the resistance of potentiometer 132 changes. Thus, the bandwidth control signal may include a new position for the sliding contact or instructions to move the sliding contact to an appropriate position to meet a desired resistance.

In some embodiments, potentiometer 132 includes a resistance ladder. The resistance ladder may include an electrical circuit of repeating units of resistive elements. Each unit may include a switching element and depending on the position of each of the switching element, the resistor ladder may have a specific resistance. Thus, the bandwidth control signal may include a new position for each switching element in the resistance ladder to meet a desired resistance.

In an embodiment, filter module 130 is configured to have a plurality of bandwidths. Each of the plurality of bandwidths may correspond to a resistance value of tunable potentiometer 132. Thus, to tune the bandwidth of filter module 130, the resistance of tunable potentiometer 132 can be adjusted to meet the desired bandwidth.

For example, responsive to receiving the bandwidth control signal, tunable potentiometer 132 may be adjusted to a predetermined resistance to meet the desired bandwidth. The bandwidth control signal may include the new resistance value that tunable potentiometer 132 should be set at to meet the desired bandwidth.

In some embodiments, filter module 130 has a maximum bandwidth and a minimum bandwidth. Further, tunable potentiometer 132 has a maximum and minimum resistance value. In an embodiment, a range from the maximum to the minimum bandwidth establishes a range of bandwidths for filter module 130.

To tune filter module 130 to the maximum bandwidth, tunable potentiometer 132 may be set at its respective minimum resistance value. Alternatively, to tune filter module 130 to the minimum bandwidth, tunable potentiometer 132 may be set at its respective maximum resistance value.

Figure 1B:
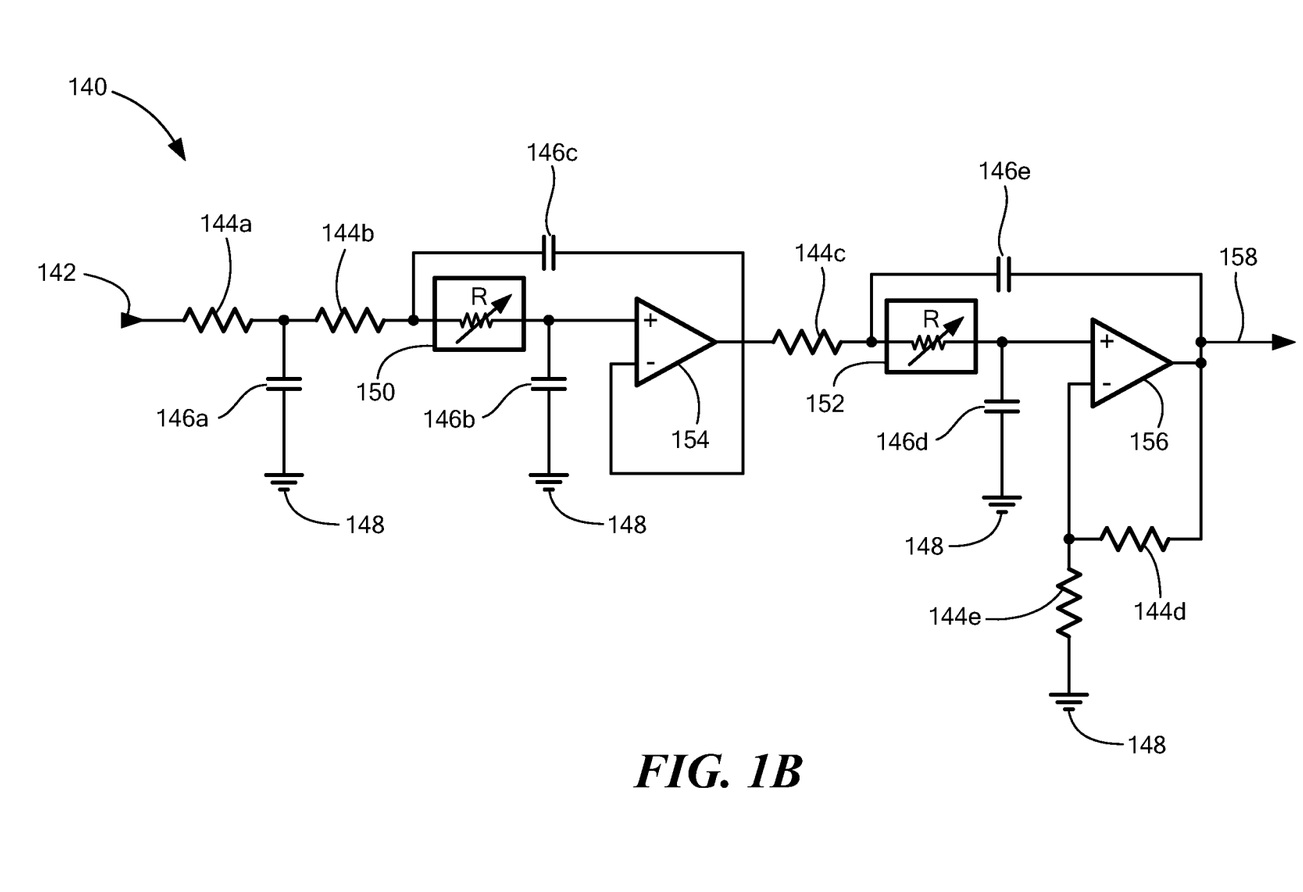
FIG. 1B is a circuit diagram of a low pass filter having a pair of tunable potentiometers.

For example, and now referring to FIG. 1B, a low-pass filter 140 is provided having two tunable potentiometers 150, 152. Low pass filter 140 may be a component of or be included within filter module 130 of FIG. 1A. In one embodiment, low pass filter 140 includes a tunable Sallen-Key low pass filter. It should be appreciated that FIG. 1B shows but one example of a low pass filter used within filter module 130 and that filter module 130 may include a variety of different filters depending on a particular application.

Low pass filter 140 has an input 142, a plurality of resistive elements 144a-14e, a plurality of capacitive elements 146a-146e, a pair of comparators 154, 156 and a pair of tunable potentiometers 150, 152. Various points of low pass filter 140 are coupled to a voltage reference 148.

In overview, input 142 is coupled to a first resistive element 144a. An output of first resistive element 144a is coupled to an input of a first capacitance element 146a and an input of a second resistive element 144b. An output of first capacitance element 146a is coupled to voltage reference 148. An output of second resistive element 144b is coupled to an input of second capacitance element 146b and an input of first potentiometer 150.

An output of first potentiometer 150 is coupled to an input of a third capacitance element 146c and a first input of comparator 150. An output of third capacitance element 146c is coupled to voltage reference 148. Further, an output of second capacitance element 146b is coupled to a second input of first comparator 154. Thus, first comparator 154 may be configured to compare the output of first potentiometer 150 to the output of second capacitance element 146b.

An output of first comparator 154 is coupled to an input of third resistive element 144c. An output of third resistive element 144c is coupled to an input of a fourth resistive element 146d and an input of second potentiometer 152. An output of second potentiometer 152 coupled to an input of a fifth capacitance element 146e and a first input of a second comparator 156. An output of fifth capacitance element 146e is coupled to voltage reference 148.

An output of fourth capacitance element 146d is coupled to an input of a fourth resistive element 144d. An output of fourth resistive element 144d is coupled to a fifth resistive element 144e and a second input of second comparator 156. An output of fifth resistive element 144e is coupled to voltage reference 148.

Second comparator 156 may be configured to compare the output of second potentiometer 152 to the output of fourth resistive element 144d and generate output 158. In an embodiment, output 158 is the output of low pass filter 140.

In an embodiment, low pass filter 140 is configured to have a plurality of bandwidths. Each of the plurality of bandwidths may correspond to a resistance of first and second potentiometers 150, 152. Thus, to tune the bandwidth of low pass filter 140, the resistance of one or both of first and second potentiometers 150, 152 can be adjusted to meet the desired bandwidth.

For example, responsive to receiving the bandwidth control signal, first tunable potentiometer 150, second tunable potentiometer 152 or both may be adjusted to a predetermined resistance to meet the desired bandwidth. The bandwidth control signal may include the new resistance values that one of or both first and second tunable potentiometers 150, 152 can be set at to meet the desired bandwidth.

Figure 1C:
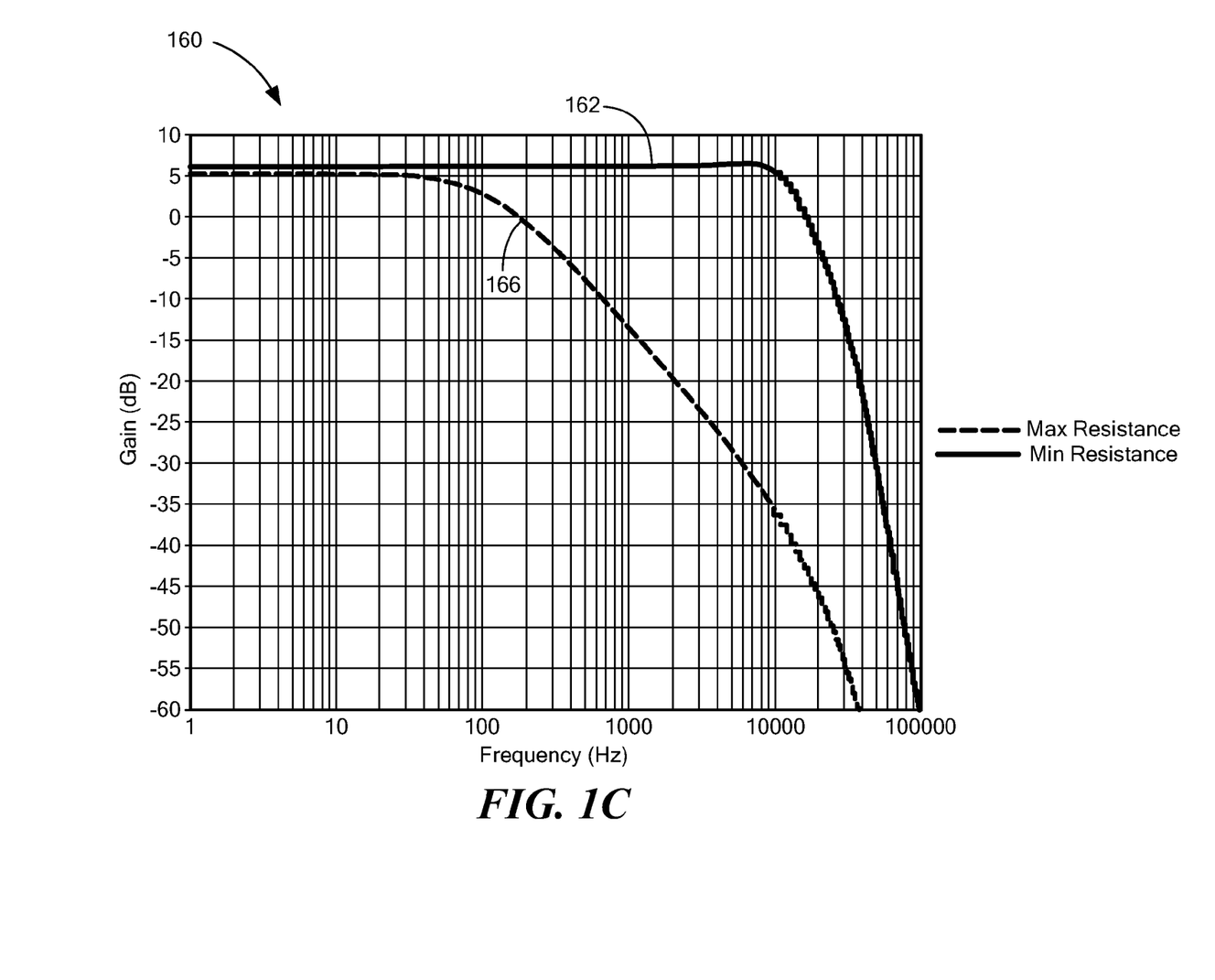
FIG. 1C is a graph comparing a first bandwidth to a second bandwidth of the low pass filter of FIG. 1B.

For example, and referring to FIG. 1C, a graph 160 shows a first bandwidth 162 and a second bandwidth 166. In graph 160, the vertical column (i.e., Y axis) units are in terms of decibels (i.e., Gain (dB)) and the horizontal column (i.e., X axis) units are in terms of Hertz (i.e., frequency (Hz)).

In an embodiment, first bandwidth 162 corresponds to a maximum bandwidth of about 10 kHz for low pass filter 140 and may correspond to a minimum resistance of each of first and second potentiometers 150, 152. Second bandwidth 166 may correspond to a minimum bandwidth of about 100 Hz for low pass filter 140 and may correspond to a maximum resistance of each of first and second potentiometers 150, 152. It should be appreciated that although FIG. 1C shows the maximum bandwidth corresponding to minimum resistance values and the minimum bandwidth corresponding to maximum resistance values, this is but one embodiment and in other embodiments, the bandwidth and resistance values may vary based on the design of the particular filter loop.

In an embodiment, low pass filter 140 may initially run with the first bandwidth 162 (i.e., maximum bandwidth). In the illustrative embodiment of FIG. 1C, each of first and second potentiometers 150, 152 are set at their respective minimum resistance values to achieve the minimum bandwidth. During operation, vibration energy experienced by low pass filter 140 may be detected above a predetermined threshold. Low pass filter 140 may receive a bandwidth control signal indicating the detected vibration energy and instructions to modify the bandwidth from a maximum bandwidth to a minimum bandwidth in response to the detected vibration energy.

Therefore, and as illustrated in FIG. 1C, the bandwidth of low pass filter 140 may be tuned from first bandwidth 162 (i.e., 100 kHz) to second bandwidth 166 (i.e., 100 Hz) responsive to the detected vibration energy.

Although FIG. 1C illustrates the bandwidth being tuned from a maximum bandwidth to a minimum bandwidth, it should be appreciated that the bandwidth may be tuned to one of a plurality of bandwidths in response to detected vibration energy. It is understood that maximum and minimum bandwidths do not need to be used.

Figure 1D:
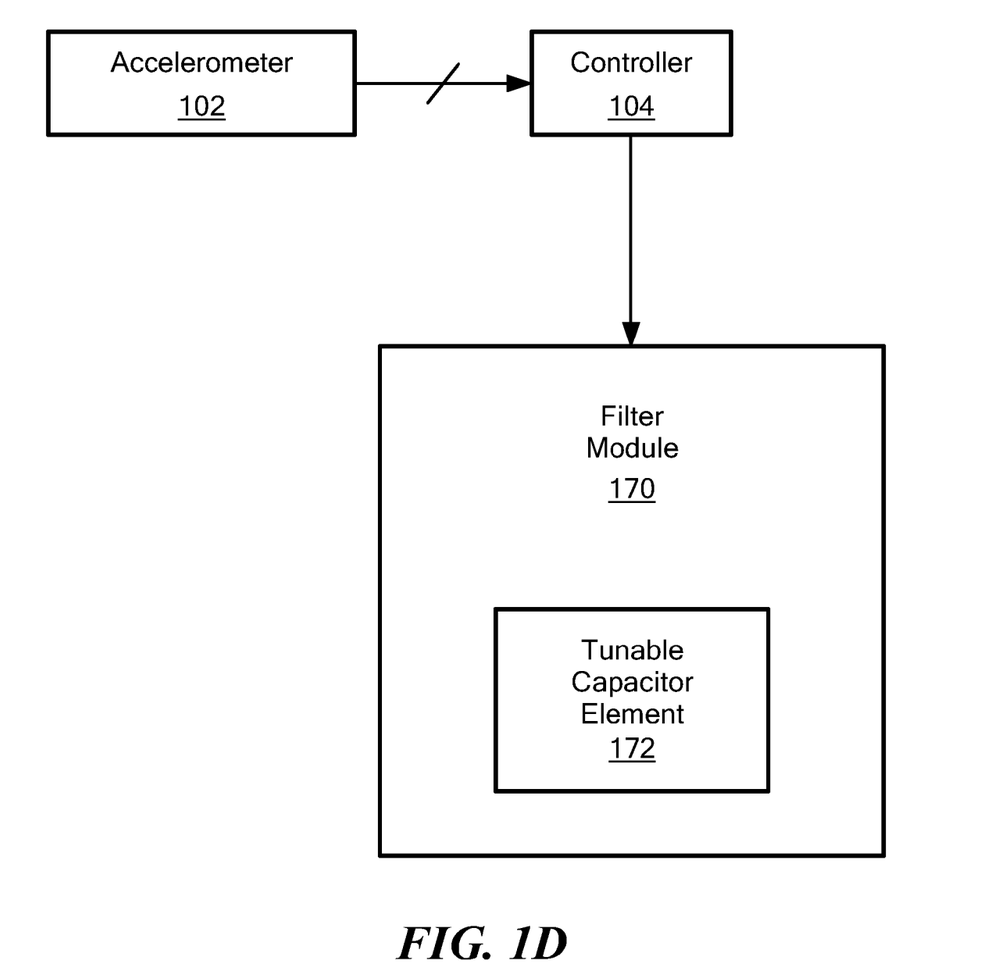
FIG. 1D is a circuit diagram of a filter module of a phase locked loop having a tunable capacitor element.

Now referring to FIG. 1D, a filter module 170 is coupled to accelerometer 102 through controller 104. In an embodiment, filter module 170 is the same as or substantially similar to filter module 106 of phase locked loop 105 of FIG. 1. Filter module 170 includes a tunable capacitor element 172.

A capacitance value of tunable capacitance element 172 can be adjusted to modify a bandwidth of filter module 170. In an embodiment, tunable capacitance element 172 includes a tunable capacitor bank having a variable capacitance. In some embodiments, tunable capacitance element 172 includes a chip scale MEMS based capacitor bank. In other embodiments, the tunable capacitance element 173 may include an analog tunable capacitor. Tunable capacitance element 172 may include a variable capacitor and/or one or more switched capacitors. A capacitance of the variable capacitor and the one or more switched capacitors may be adjusted to achieve a desired bandwidth for filter module 170.

The bandwidth control signal may include a new or modified bandwidth based on the detected vibration energy. In some embodiments, the bandwidth control signal includes new or modified capacitance values for tunable capacitor element 172. The new or modified capacitance values may correspond to the new or modified bandwidth of filter module 106. Thus, an output or capacitance of tunable capacitor element 172 can be controlled by the bandwidth control signal.

For example, responsive to receiving the bandwidth control signal, tunable capacitor element 172 may be adjusted to a predetermined capacitance value to meet the desired bandwidth. The bandwidth control signal may include the new capacitance value that tunable capacitor element 172 can be set at to meet the desired bandwidth.

Figure 2:
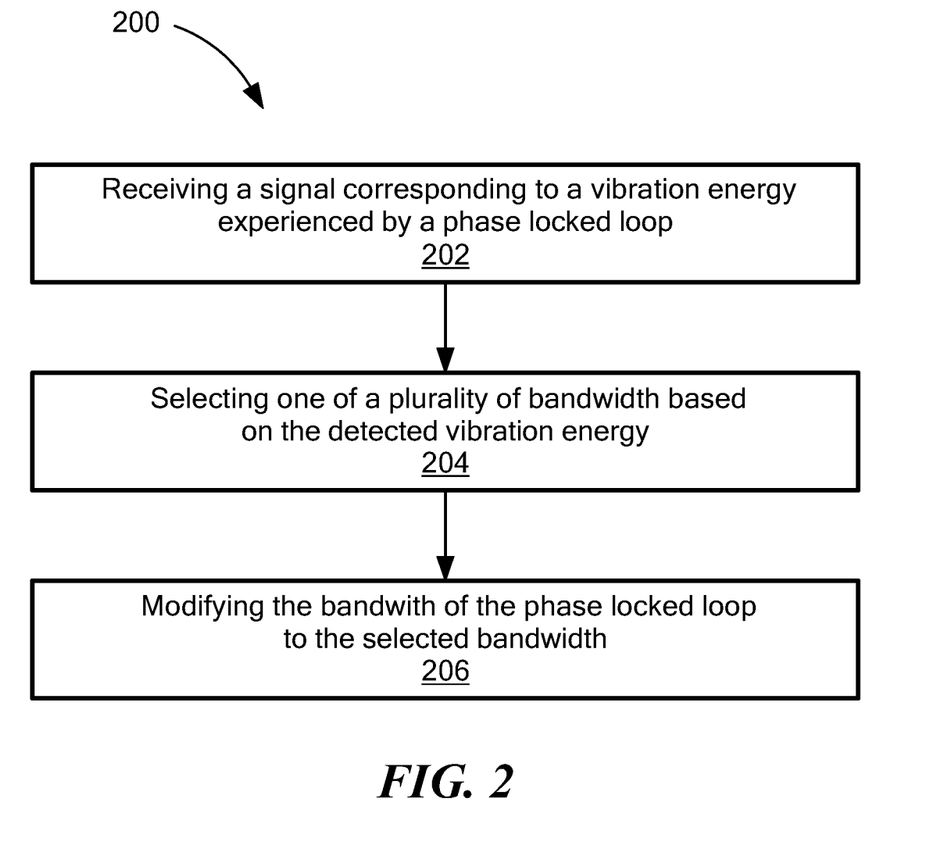
FIG. 2 is a flow diagram of a method for tuning a phase locked loop.

Now referring to FIG. 2, a method 200 for tuning a phase locked loop includes receiving a signal corresponding to a vibration energy experienced by a phase locked loop (202), selecting one of a plurality of bandwidths based on the detected vibration energy (204) and modifying the bandwidth of the phase locked loop to the selected bandwidth (206).

In an embodiment, the signal, such as vibration signal, is received that corresponds to the vibration energy experienced by the phase locked loop. A detector (e.g., accelerometer) may be provided to detect vibration energy. The detector may be disposed proximate to the phase locked loop. The detector can measure a magnitude and frequency of vibration energy in at least one of three axes (e.g., x-axis, y-axis, z-axis). In an embodiment, the detector generates the vibration signal and transmits it to a controller.

The controller may be disposed such that it is between the detector and the phase locked loop (e.g., in a communications path or a signal path between the detector and the phase locked loop). The controller can receive the vibration signal and generate a bandwidth control signal to modify the bandwidth of the phase locked loop based on the vibration signal.

In an embodiment, the phase locked loop is configured for a plurality of bandwidths. Each of the bandwidths corresponds to a vibration excitation level (e.g., vibration energy level). Responsive to receiving the vibration signal, a new or modified bandwidth can be selected based on the detected vibration energy. In one embodiment, the controller selects one of the plurality of bandwidths based on the detected vibration energy.

In an embodiment, a new bandwidth may be determined as the detected vibration energy is received. For example, a controller may be provided that actively determines new bandwidths for the phase locked loop based on performance thresholds for the phase locked loop, the components within the phase locked loop, environmental properties around the phase locked loop and points of stability for the phase locked loop.

In other embodiments, a controller may utilize a lookup table. For example, the controller may use the detected vibration energy value to identify a predetermined bandwidth and point of stability corresponding to the detected vibration energy. The bandwidth and point of stability may be predetermined based on a desired performance characteristic of the phase locked loop under different levels of vibration excitation. Thus, a bandwidth can be selected that optimizes a performance of the phase locked loop at a plurality of different levels.

For example, in some embodiments, the bandwidth of the phase locked loop can be reduced as the vibration level increases. Alternatively, the bandwidth of the phase locked loop can be increased as the vibration level decreases.

In some embodiments, a bandwidth is selected responsive to a detected vibration energy being above or below a threshold. Each threshold may indicate an allowable range of vibration energy for each bandwidth. Thus, a detected vibration above or below the respective threshold may indicate that the bandwidth needs to be adjusted.

For example, in one embodiment, a minimum bandwidth may be selected based on a detected vibration energy above a first threshold. Alternatively, a maximum bandwidth may be selected based on a detected vibration energy below the first threshold. As stated above, the phase locked loop may have a plurality of bandwidths, with each bandwidth corresponding to respective vibration excitation level and thus corresponding to a particular threshold value.

In an embodiment, the bandwidth control signal includes the new bandwidth for phase locked loop. The bandwidth control signal may include new values for different components (e.g., a tunable potentiometer, a tunable capacitor element) of the phase locked loop in order to achieve the new bandwidth.

For example, the phase locked loop may include a filter module. The filter module may include a low pass filter having either a potentiometer that can be controlled by the bandwidth control signal or at least one adjustable capacitor that can be controlled by the bandwidth control signal. The filter module can be configured for a plurality of bandwidths by modifying the respective values of either the potentiometer or adjustable capacitor.

Figure 2A:
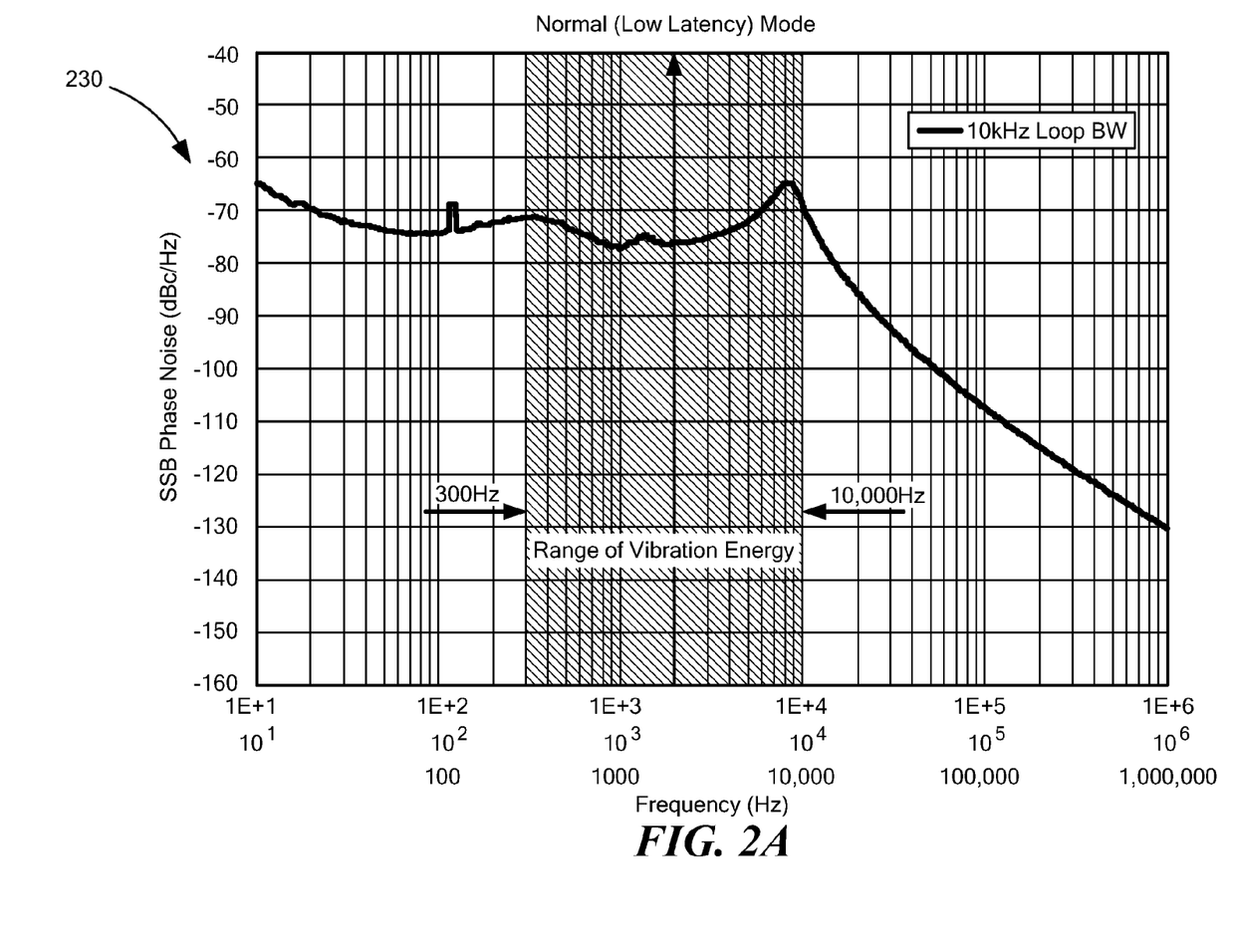
FIG. 2A is a graph comparing a first bandwidth to a range of detected vibration energy.
Figure 2B:
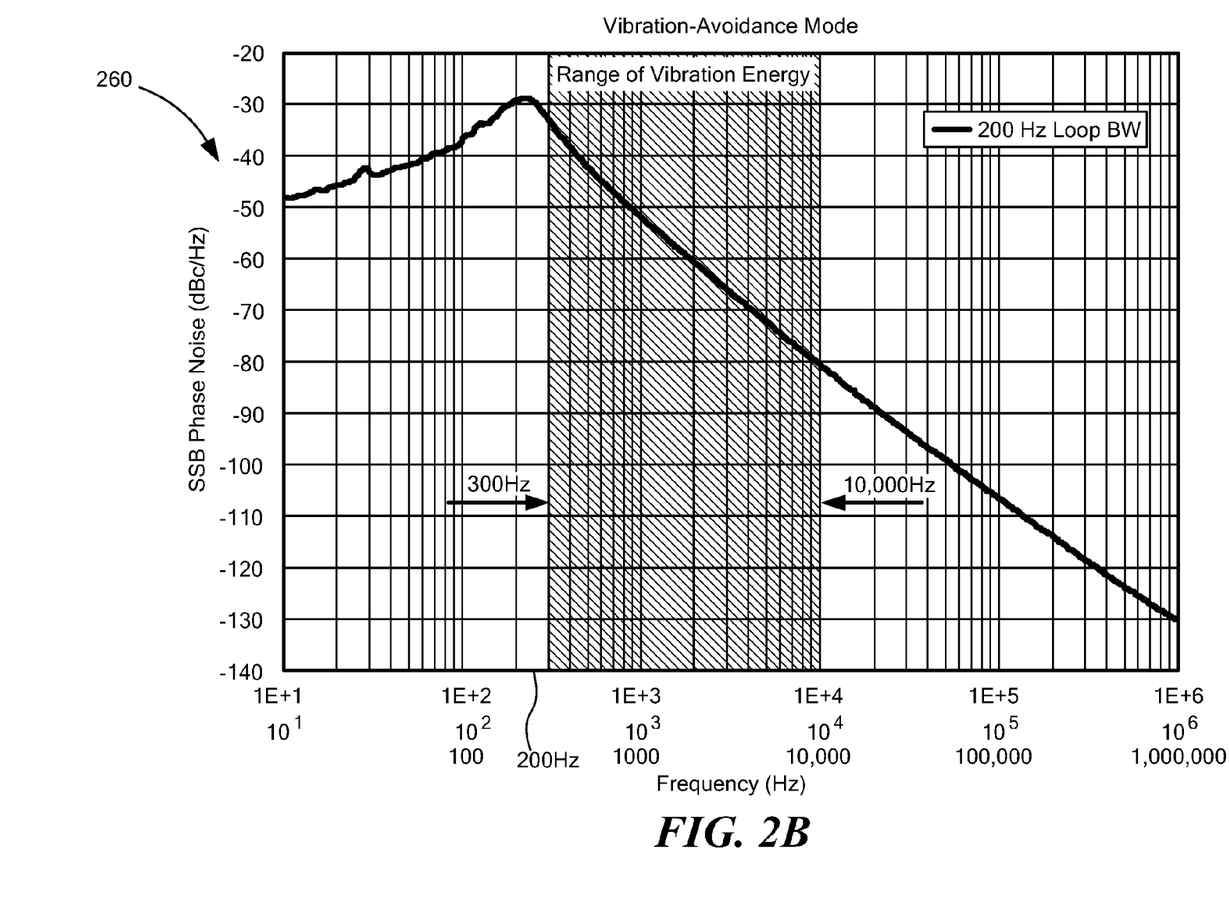
FIG. 2B is a graph depicting a second bandwidth to the range of detected vibration energy of FIG. 2A.

For example and referring briefly to FIGS. 2A and 2B, graphs 230 and 260 compare a phase noise of a phase locked loop to a detected range of vibration energy. In each graph 230, 260, the vertical column (i.e., Y axis) units are in terms of decibels relative to a carrier per hertz (i.e., a single sideband (SSB) phase noise (dBc/Hz)) and the horizontal column (i.e., X axis) units are in terms of hertz (i.e., frequency (Hz)).

In FIG. 2A, graph 230 illustrates a phase locked loop having a bandwidth of 10 kHz (see bandwidth 162 of FIG. 1C). Further, graph 230 shows a range of vibration energy detected that is between about 300 Hz to about 10 KHz. In an embodiment, because the vibration energy is within the bandwidth of the phase locked loop, the vibration energy degrades performance of the phase locked loop. Thus, the bandwidth can be modified so that the vibration energy is outside of the phase locked loop bandwidth, to attenuate this vibration energy.

Now referring to FIG. 2B, the bandwidth of the phase locked loop has been reduced to a new bandwidth of about 0 Hz to about 200 Hz. The new bandwidth of 200 Hz is less than a lowest value (i.e., about 300 Hz) of the range of detected vibration energy. Thus, the vibration energy that is outside the new bandwidth of 200 Hz is heavily attenuated so as to reduce the impact on phase locked loop performance.

In other embodiments, the vibration energy may decrease below a threshold. Therefore, in response to detecting the decreased vibration energy, the bandwidth may be increased (e.g., widened). In some embodiments, the bandwidth is increased to a maximum bandwidth based on the detected vibration energy.

Figure 3:
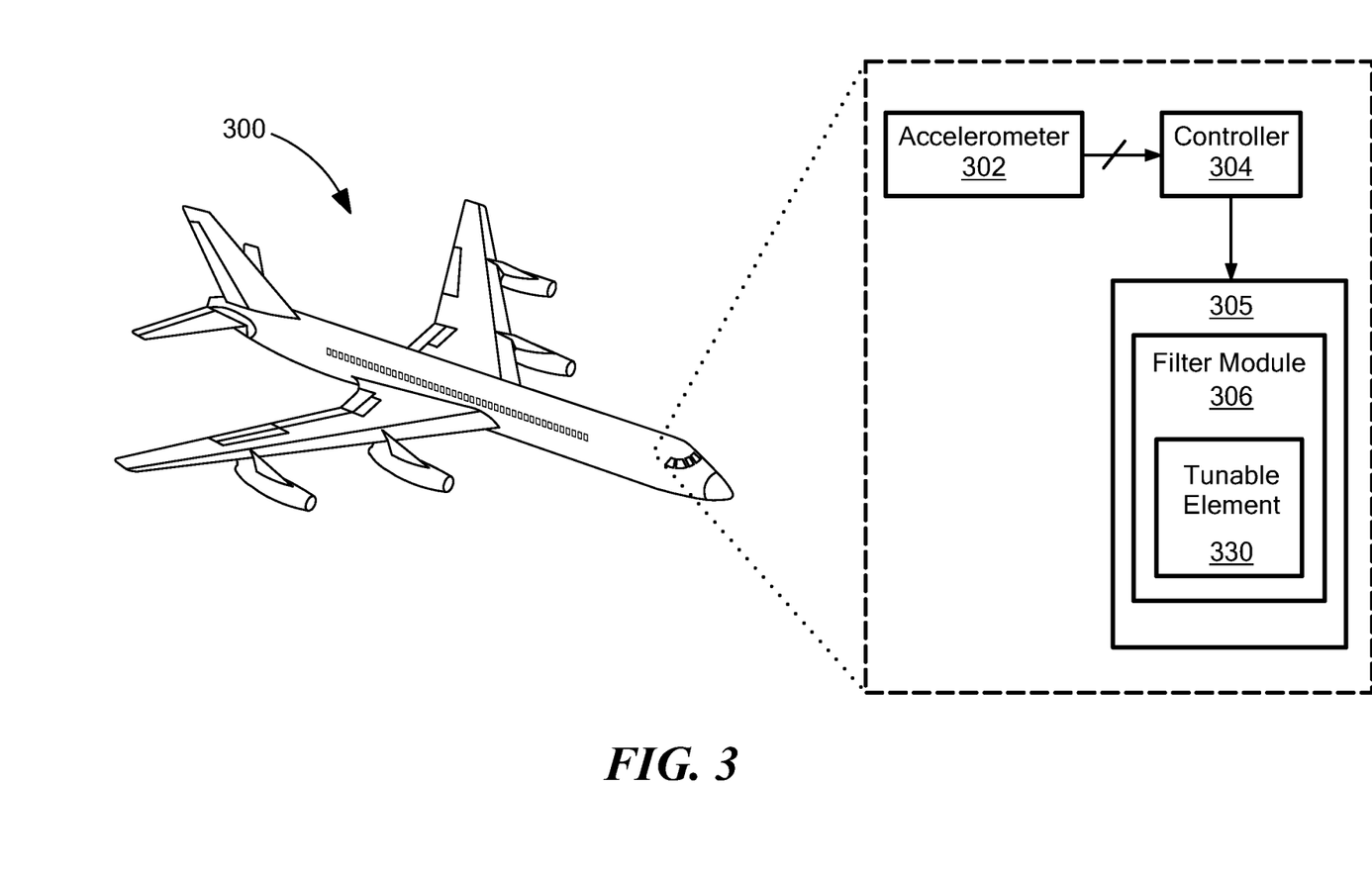
FIG. 3 is a block diagram of plane having a having a tunable phase locked loop.

Referring now to FIG. 3, a plane 300 includes an accelerometer 302, controller 304 and a phase locked loop 305. Phase locked loop 305 includes a filter module 306 having a tunable element 330. In an embodiment, accelerometer 302, controller 304, phase locked loop 305, filter module 306 and tunable element 330 may be the same or substantially similar to accelerometer 102, controller 104, phase locked loop 105, filter module 106 of FIG. 1 respectively. Tunable element 330 may the same or substantially similar to tunable potentiometer 132 of FIG. 1A or tunable capacitor element 172 of FIG. 1D.

During different periods of a flight, such as take-off, mid-flight turbulence and landing, plane 300 can experience different levels of vibration. For example, vibration levels can be greater than a threshold level during take-off and landing, while vibration levels can be below the same threshold level during mid-flight periods. Alternatively, plane 300 may experience turbulence during the mid-flight portion and experience vibration levels above the threshold level. Components and systems of plane 300, including the communication systems, can be adversely effected by the high levels (i.e., above the threshold level) of vibration.

In the illustrative embodiment of FIG. 3, phase locked loop 305 of plane 300 includes tunable element 330 to compensate for the adverse effects of vibration experienced during each portion of a flight and to maintain integrity of its communication systems. Tunable element 330 may include a tunable potentiometer or a tunable capacitor element. Filter module 306 can actively modify tunable element 330 during each portion of a flight to compensate for the vibration experienced by plane 300 and phase locked loop 305.

In an embodiment, accelerometer 302 and controller 304 may be communicatively coupled to phase locked loop 305. Accelerometer 302 can detect a vibration corresponding to a vibration energy experienced by phase locked loop 305 and generate a vibration signal that is transmitted to controller 304. Controller 304 is configured to receive the vibration signal and generate a bandwidth control signal.

The bandwidth control signal may include a new or modified bandwidth for filter module 306 based on the detected vibration energy. In some embodiments, the bandwidth control signal includes new or modified values for tunable element 330 (e.g., resistance values, capacitance values). The new or modified values may correspond to the new or modified bandwidth of filter module 306. Thus, an output of tunable element 330 can be controlled by the bandwidth control signal.

In an embodiment, filter module 306 can be configured to have a plurality of bandwidths. Thus, to tune the bandwidth of filter module 306, the values of tunable element 330 can be adjusted to meet the desired bandwidth. For example, in one embodiment, the values of a capacitance element in tunable element 330 can be adjusted to meet the desired bandwidth. In other embodiments, the values of a resistance element in tunable element 330 can be adjusted to meet the desired bandwidth. In some embodiments, responsive to receiving the bandwidth control signal, tunable element 330 may be adjusted to a predetermined value to meet the desired bandwidth.

Figure 4:
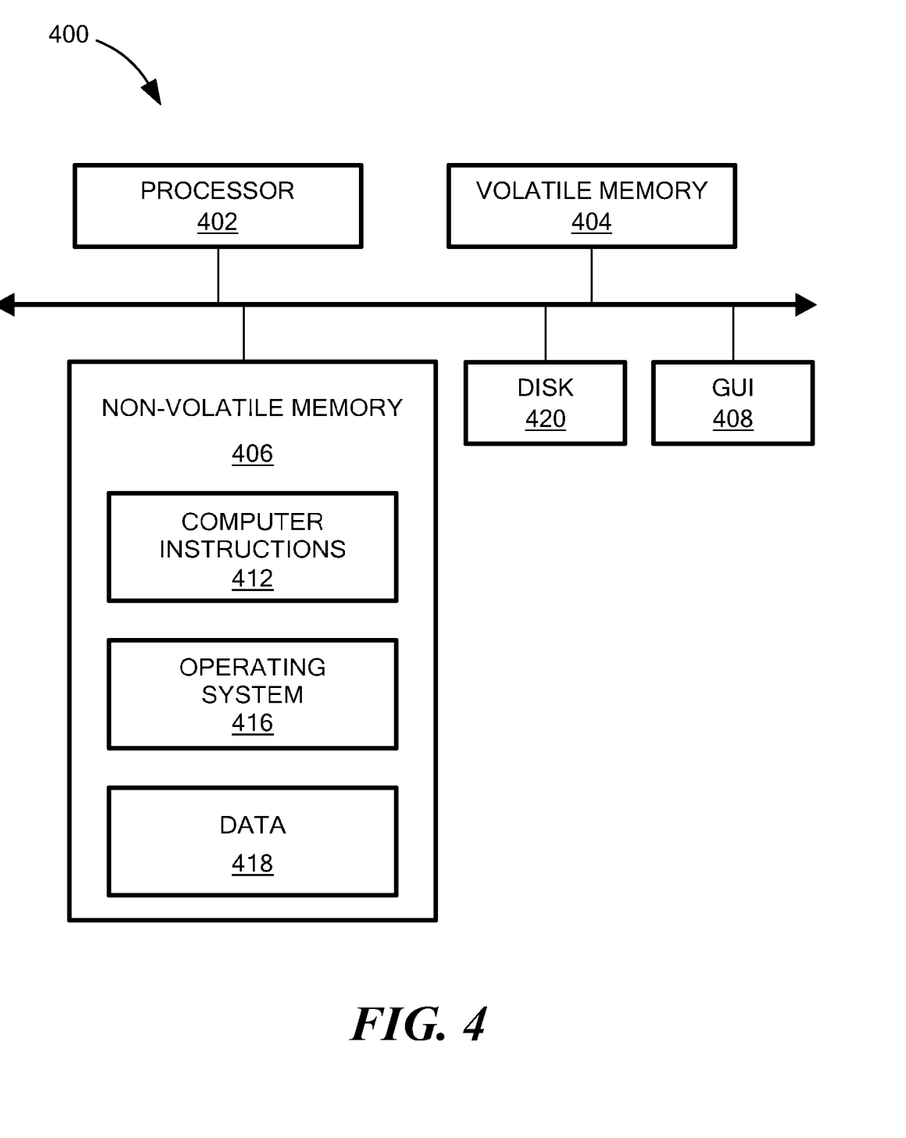
FIG. 4 is a block diagram of an embodiment of a computer system.

Referring to now FIG. 4, a computer 400 includes a processor 402, a volatile memory 404, a non-volatile memory 406 (e.g., hard disk), a graphical user interface (GUI) 408 (e.g., a mouse, a keyboard, a display, for example) and a computer disk 420. The non-volatile memory 406 stores computer instructions 412, an operating system 416 and data 418 including a plurality of vibration excitation levels and corresponding bandwidths and performance thresholds for a phase locked loop, for example. In some embodiments, non-volatile memory 406 includes a look-up table that stores and organizes data corresponding to the plurality of vibration excitation levels and the corresponding bandwidths and performance thresholds for a phase locked loop. In one example, the computer instructions 412 are executed by the processor 402 out of volatile memory 404 to perform all or part of the method (or process) 200 of FIG. 2.

In an embodiment, computer 400 may be the same as or substantially similar to controller 104 of FIGS. 1-1A and 1D. Computer 400 may perform all of the same functions and be configured to receive and generate the same data as controller 104, as described herein. For example, computer 400 may be configured to receive a vibration signal from an accelerometer, such as accelerometer 102 of FIG. 1. Further, computer 400 may be configured to generate a bandwidth control signal and transmit the bandwidth control signal to a phase locked loop, such as phase locked loop 105 of FIG. 1.

Method 200 is not limited to use with the hardware and software of FIG. 4; they may find applicability in any computing or processing environment and with any type of machine or set of machines that is capable of running a computer program. Method 200 may be implemented in hardware, software, or a combination of the two. Method 200 may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform method 200 and to generate output information.

The system may be implemented, at least in part, via a computer program product, (e.g., in a machine-readable storage device), for execution by, or to control the operation of, data processing apparatus (e.g., a programmable processor, a computer, or multiple computers)). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer to perform method 200. Method 200 may also be implemented as a machine-readable storage medium, configured with a computer program, where upon execution, instructions in the computer program cause the computer to operate in accordance with method 200.

Method 200 may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

A number of embodiments of the disclosure have been described. Nevertheless, it will be understood that various modifications may be made without departing from the spirit and scope of the disclosure. For example, the high and low impedance lines may be by varied using both the ground plane height and the width of the center conductor line. In another embodiment, in the helical slow wave embodiment, the ground plane reference could be manifested by placing the coil inside a metal container shield with air or dielectric gaps between the coil and the metal shield.

Elements of different embodiments described herein may be combined to form other embodiments not specifically set forth above. Other embodiments not specifically described herein are also within the scope of the following claims.

What is claimed is:

1. A system, comprising:
   a phase locked loop comprising:
   a controllable oscillator having an input and an output;
   an output module coupled to the output of the controllable oscillator;
   a filter module coupled to the input of the controllable oscillator, the filter module configured to receive a bandwidth control signal to modify a bandwidth of the phase locked loop based on a vibration signal, the vibration signal corresponding to a vibration level experienced by the phased locked loop, and wherein the filter module is configured for a first bandwidth corresponding to the vibration level at or above a first threshold and a second bandwidth corresponding to the vibration level at or below the first threshold, and wherein the filter module is configured to reduce the bandwidth as the vibration level increases and/or increase the bandwidth as the vibration level decreases; and
   a detector coupled to an input of the filter module, the detector configured to receive a PLL output signal from the output module and to receive a PLL input signal.

2. The system according to claim 1, further comprising a controller coupled to the filter module, the controller configured to receive the vibration signal, and to output the bandwidth control signal to the filter module.

3. The system according to claim 1, further including an accelerometer to detect vibration energy and generate the vibration signal.

4. The system according to claim 1, wherein the first bandwidth is less than the second bandwidth.

5. The system according to claim 1, wherein the filter module is configured to modify the bandwidth of the phase locked loop so that a frequency of the vibration experienced by the phased locked loop is outside the second bandwidth.

6. The system according to claim 1, wherein the filter module includes a potentiometer controlled by the bandwidth control signal.

7. The system according to claim 1, wherein the filter module includes at least one adjustable capacitor controlled by the bandwidth control signal.

8. A method for tuning a phase locked loop, the method comprising:
   receiving a bandwidth control signal to modify a bandwidth of a phase locked loop based on a vibration signal, the vibration signal corresponding to a vibration level experienced by the phased locked loop;
   selecting one of a plurality of bandwidths based on the bandwidth control signal; and
   modifying the bandwidth of the phase locked loop to the selected bandwidth such that the bandwidth is configured for a first bandwidth corresponding to the vibration level at or above a first threshold and a second bandwidth corresponding to the vibration level at or below the first threshold, wherein the bandwidth is reduced as the vibration level increases and/or increased as the vibration level decreases.

9. The method according to claim 8, further comprising:
   receiving the vibration signal, and
   generating the bandwidth control signal to modify the bandwidth of the phase locked loop based on the vibration signal.

10. The method of claim 8, further comprising providing a detector to generate the vibration signal corresponding to the vibration level.

11. The method of claim 8, wherein the phase locked loop comprises a filter module and the filter module is configured for the first bandwidth corresponding to the vibration level at or above the first threshold and the second bandwidth corresponding to the vibration level at or below the first threshold.

12. The method according to claim 11, wherein the first bandwidth is less than the second bandwidth.

13. The method according to claim 11, further comprising modifying the bandwidth of the phase locked loop so that a frequency of the vibration level experienced by the phased locked loop is outside the second bandwidth.

14. The method according to claim 11, further comprising modifying a capacitance value within the filter module based on the bandwidth control signal to transition the filter module from the first bandwidth to the second bandwidth.

15. The method according to claim 11, further comprising modifying a resistance value within the filter module based on the bandwidth control signal to transition the filter module from the first bandwidth to the second bandwidth.

16. The method according to claim 11, further comprising:
   receiving the bandwidth control signal to modify the bandwidth of the phase locked loop based on the vibration signal, the vibration signal corresponding to a second vibration level experienced by the phased locked loop, wherein the second vibration level is below the first threshold; and
   modifying the bandwidth of the filter module from the first bandwidth to the second bandwidth responsive to the bandwidth control signal.

17. A phase locked loop, comprising:
   a controllable oscillator for generating an oscillator signal;
   a means for receiving the oscillator signal and generating a PLL output signal;
   a means for receiving a bandwidth control signal to modify a bandwidth of the phase locked loop based on a vibration signal, the vibration signal corresponding to a vibration level experienced by the phased locked loop;
   a means for modifying the bandwidth such that the bandwidth is configured for a first bandwidth corresponding to the vibration level at or above a first threshold and a second bandwidth corresponding to the vibration level at or below the first threshold, and wherein the bandwidth is reduced as the vibration level increases and/or increased as the vibration level decreases; and
   a detector for receiving the PLL output signal and a PLL input signal.

* * * * *